United States Patent
Okuyama et al.

(10) Patent No.: US 9,859,359 B2
(45) Date of Patent: Jan. 2, 2018

(54) SEMICONDUCTOR DEVICE

(71) Applicant: SEIKO EPSON CORPORATION, Tokyo (JP)

(72) Inventors: Masaki Okuyama, Tsuruoka (JP); Hisakatsu Sato, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/049,839

(22) Filed: Feb. 22, 2016

(65) Prior Publication Data

US 2016/0204095 A1 Jul. 14, 2016

Related U.S. Application Data

(62) Division of application No. 14/358,982, filed as application No. PCT/JP2012/007661 on Nov. 29, 2012, now Pat. No. 9,312,329.

(30) Foreign Application Priority Data

Dec. 9, 2011 (JP) .................................. 2011-269891

(51) Int. Cl.
*H01L 27/02* (2006.01)
*H01L 29/06* (2006.01)
(Continued)

(52) U.S. Cl.
CPC ...... *H01L 29/0615* (2013.01); *H01L 27/0255* (2013.01); *H01L 27/0259* (2013.01);
(Continued)

(58) Field of Classification Search
CPC ............. H01L 29/0615; H01L 27/0255; H01L 29/0684; H01L 29/744; H01L 29/36; H01L 27/0259
See application file for complete search history.

(56) References Cited

U.S. PATENT DOCUMENTS 6,229,182 B1 5/2001 Van Lieverloo
6,835,624 B2 12/2004 Pong et al.
(Continued)

FOREIGN PATENT DOCUMENTS

JP H11-135735 A 5/1999
JP H11-154732 A 6/1999
(Continued)

OTHER PUBLICATIONS

Feb. 12, 2013 International Search Report issued in International Patent Application No. PCT/JP2012/007661.
(Continued)

*Primary Examiner* — Su C Kim

(74) *Attorney, Agent, or Firm* — Oliff PLC

(57) ABSTRACT

A first impurity diffusion region is provided within a semiconductor substrate, a second impurity diffusion region is provided within the first impurity diffusion region, a third impurity diffusion region is provided within the second impurity diffusion region, a first portion of a fourth impurity diffusion region is provided within the second impurity diffusion region so as to be spaced from the third impurity diffusion region, and a second portion of the fourth impurity diffusion region is provided in a third portion of the first impurity diffusion region on a side of a surface of the semiconductor substrate, a first contact is provided so as to be in contact with the second portion, the first contact and the third portion overlap in plan view, and a first power supply is connected to the third impurity diffusion region.

18 Claims, 7 Drawing Sheets

(51) Int. Cl.
  *H01L 29/36* (2006.01)
  *H01L 29/45* (2006.01)
  *H01L 29/744* (2006.01)

(52) U.S. Cl.
  CPC .......... *H01L 29/0684* (2013.01); *H01L 29/36* (2013.01); *H01L 29/45* (2013.01); *H01L 29/744* (2013.01)

(56) References Cited

U.S. PATENT DOCUMENTS

| | | |
|---|---|---|
| 7,064,392 B1 | 6/2006 | Morishita |
| 7,821,029 B2 | 10/2010 | Imahashi |
| 2001/0015459 A1 | 8/2001 | Watanabe et al. |
| 2005/0263843 A1 | 12/2005 | Sakakibara |
| 2005/0275032 A1* | 12/2005 | Kodama ............... H01L 23/585 257/355 |
| 2007/0052029 A1* | 3/2007 | Cheng ................ H01L 29/7816 257/355 |
| 2007/0241407 A1 | 10/2007 | Kim et al. |
| 2010/0006936 A1 | 1/2010 | Matsudai et al. |
| 2010/0078721 A1* | 4/2010 | Fujii ................... H01L 29/0653 257/344 |

FOREIGN PATENT DOCUMENTS

| | | |
|---|---|---|
| JP | 2001-035935 A | 2/2001 |
| JP | 2002-026315 A | 1/2002 |
| JP | 2002-518831 A | 6/2002 |
| JP | 2003-273353 A | 9/2003 |
| JP | 2006-013450 A | 1/2006 |
| JP | 2008-004703 A | 1/2008 |
| JP | 2008-199032 A | 8/2008 |
| JP | 2010-021228 A | 1/2010 |
| JP | 2010-050328 A | 3/2010 |

OTHER PUBLICATIONS

Dec. 4, 2015 Notice of Allowance issued in U.S. Appl. No. 14/358,982.
Jun. 17, 2015 Office Action issued in U.S. Appl. No. 14/358,982.

* cited by examiner

SEMICONDUCTOR DEVICE

This is a Divisional Application of application Ser. No. 14/358,982 filed May 16, 2014, which is a National Phase of PCT/JP2012/007661 filed Nov. 29, 2012. The disclosures of the prior applications are hereby incorporated by reference herein in their entirety.

TECHNICAL FIELD

The present invention relates to a semiconductor device, and particularly to a structure for protecting a circuit from a surge current resulting from static electricity or the like.

BACKGROUND ART

Conventionally, semiconductor devices have been formed by making various elements. One of such semiconductor devices is a semiconductor device that includes both a digital circuit and an analog circuit. For the digital circuit portion, it is less likely that signal values are confused because, with respect to a voltage level called a threshold, which is the boundary between high level voltages and low level voltages, the voltage levels of a signal to be handled are close to end points of the variable range. Thus, advantageously, handling of the voltage levels not close to the threshold is not so severe as compared with the case of an analog signal. For most digital circuits, the signal level is determined based on the signal voltage level at the switching timing of an operation clock signal serving as the reference. Accordingly, a disturbance in the voltage level at timing other than the switching timing of the operation clock signal often will not affect the processing result of the digital circuit. In contrast, for the analog circuit portion, it is important that the voltage levels of a signal that is to be handled are accurately detected, transmitted, and processed, and a disturbance in the signal voltage will significantly affect the processing result.

A disturbance in the signal voltage occurs owing to the effects of various noises. For example, the effect on the internal elements by a noise provided from the outside of the semiconductor device may be reduced by enhancing the so-called shielding performance of the semiconductor device. However, some noises are generated inside the semiconductor element. For example, in a digital element, a noise is generated during switching from the high level to the low level, as well as switching from the low level to the high level. Such a switching noise may not lead to a malfunction in a digital circuit, but will significantly affect the processing in an analog circuit. To deal with such a problem, a structure called a triple well may be adopted that isolates an analog element from a digital element within the semiconductor device.

However, as with other structures, the triple well structure also has a problem in that the internal elements may undergo breakdown due to a surge current from ESD (electrostatic discharge) or the like. An example of measures against a surge current is the method disclosed in Patent Literature 1.

CITATION LIST

Patent Literature

Patent Literature 1: JP-A-11-135735

SUMMARY OF INVENTION

Technical Problem

To allow an injected charge due to a surge to be discharged to a desired region such as a GND via an element composed of a plurality of impurity diffusion regions provided in a semiconductor substrate, the arrangement of the impurity diffusion regions and the potential control are very important. In particular, for an impurity region where the injected charge due to a surge reaches the semiconductor substrate via an external terminal, an interconnect, and a contact, the potential difference at the boundary with a region around the impurity region widens, which may lead to electrostatic breakdown. Electrostatic breakdown is likely to occur especially at the boundary located immediately below the contact.

Solution to Problem

The invention has been made in order to solve the above-described problems or at least one of the problems, and can be implemented in the form of the following application examples or embodiments.

Application Example 1

A semiconductor device according to the present application example includes: a semiconductor substrate of a first conductivity type; a first impurity diffusion region of a second conductivity type; a second impurity diffusion region of the first conductivity type; a third impurity diffusion region of the second conductivity type; a fourth impurity diffusion region of the second conductivity type; a first contact; and a first power supply, wherein: the first impurity diffusion region is provided within the semiconductor substrate; the second impurity diffusion region is provided within the first impurity diffusion region; the third impurity diffusion region is provided within the second impurity diffusion region; a first portion of the fourth impurity diffusion region is provided within the second impurity diffusion region so as to be spaced from the third impurity diffusion region, and a second portion of the fourth impurity diffusion region is provided in a third portion of the first impurity diffusion region on a side of a surface of the semiconductor substrate; the first portion and the second portion are continuous; the first contact is provided so as to be in contact with the second portion; the first contact and the third portion overlap in plan view; and the first power supply is connected to the third impurity diffusion region. As used herein, being "spaced from" means that keeping an appropriate distance without coming into contact.

With this configuration, the semiconductor device includes a semiconductor substrate of a first conductivity type; a first impurity diffusion region of a second conductivity type; a second impurity diffusion region of the first conductivity type; a third impurity diffusion region of the second conductivity type; a fourth impurity diffusion region of the second conductivity type; a first contact; and a first power supply, wherein: the first impurity diffusion region is provided within the semiconductor substrate; the second impurity diffusion region is provided within the first impurity diffusion region; the third impurity diffusion region is provided within the second impurity diffusion region; a first portion of the fourth impurity diffusion region is provided within the second impurity diffusion region so as to be spaced from the third impurity diffusion region, and a second portion of the fourth impurity diffusion region is provided in a third portion of the first impurity diffusion region on a side of a surface of the semiconductor substrate; the first portion and the second portion are continuous; the first contact is provided so as to be in contact with the second portion; the first contact and the third portion overlap in plan view; and the first power supply is connected to the third impurity diffusion region. Thereby, it is possible to reduce breakdown in the fourth impurity diffusion region due to a surge current penetrated into the first contact or breakdown in a region around the fourth impurity diffusion region. In particular, it is possible to prevent breakdown in a region where the fourth impurity diffusion region immediately below the first contact is in contact with another region.

In the case of using a semiconductor substrate of the first conductivity type, a semiconductor device having a conventional triple well structure includes an impurity diffusion region of the first conductivity type formed below an impurity diffusion region of the second conductivity type to which a contact is connected, and an impurity diffusion region of the second conductivity type formed below the impurity diffusion region of the first conductivity type. In other words, layers are present below the contact in the order: a layer of the second conductivity type, a layer of the first conductivity type, a layer of the second conductivity type, and a layer (substrate) of the first conductivity type, when viewed from the contact. In this case, when a surge current penetrates into the contact, breakdown is likely to occur at the interface between the layer of the second conductivity type to which the contact is connected and the layer of a different conductivity type, i.e., the first conductivity type immediately below that layer of the second conductivity type.

In contrast, in the semiconductor device according to the invention, the first impurity diffusion region of the second conductivity is located below the fourth impurity diffusion region of the second conductivity to which the first contact is connected. Accordingly, the fourth impurity diffusion region and the first impurity diffusion region have the same conductivity type, and thus, breakdown does not easily occur at the boundary therebetween. Furthermore, the first impurity diffusion region is a layer having the function of isolating elements such as an analog element and a digital element, and the size of the area of the first impurity diffusion region when the semiconductor device is viewed in plan view is larger than the size of the area of the other impurity diffusion regions described above. Accordingly, it seems that the effect of a surge current at the boundary between the first impurity diffusion region and the semiconductor substrate is smaller than that at the boundary with the fourth impurity diffusion region.

The first power supply is connected to the third impurity diffusion region of the second conductivity type. The first power supply may be a GND, for example. Furthermore, it is possible to appropriately control the barrier between the fourth impurity diffusion region and the third impurity diffusion region by providing a gate controlled diode (GCD) or the like between the first portion of the fourth impurity diffusion region and the third impurity diffusion region.

Application Example 2

In the semiconductor device according to the above-described application example, it is preferable that the first contact and a predetermined region of the first impurity diffusion region are connected to each other by a first interconnect, the predetermined region being capable of sandwiching the second impurity diffusion region between itself and the third portion.

With this configuration, the first contact and a predetermined region of the first impurity diffusion region are connected to each other by a first interconnect, the predetermined region being capable of sandwiching the second impurity diffusion region between itself and the third portion. Thereby, a voltage resulting from a surge voltage is applied to a wide region of the first impurity diffusion region, across the second impurity diffusion region where elements are mainly formed, thus making it possible to reduce the occurrence of a potential difference within the first impurity diffusion region. Accordingly, it is possible to suppress the flow of a surge current outside the route to the first power supply, thus reducing breakdown due to a surge current.

Application Example 3

A semiconductor device according to the present application example includes a semiconductor substrate of a first conductivity type; a first impurity diffusion region of a second conductivity type that is provided within the semiconductor substrate; a second impurity diffusion region of the first conductivity type that is provided within the first impurity diffusion region; a third impurity diffusion region of the second conductivity type that is provided within the second impurity diffusion region; a fourth impurity diffusion region of the second conductivity type; a fifth impurity diffusion region of the second conductivity type that is provided within the second impurity diffusion region; a first contact; and a first power supply, wherein: the second impurity diffusion region is disposed so as to, in plan view, be surrounded by a first region of the first impurity diffusion region and surround a second region of the first impurity diffusion region; the third impurity diffusion region and the fifth impurity diffusion region are disposed such that the second region is located therebetween in plan view; the fourth impurity diffusion region is disposed between the third impurity diffusion region and the fifth impurity diffusion region in plan view; the fourth impurity diffusion region includes a first portion, a second portion, and a third portion, the second portion is disposed in the second region, the first portion is disposed in the second impurity diffusion region toward the third impurity diffusion region so as to be spaced from the third impurity diffusion region, and the third portion is disposed in the second impurity diffusion region toward the fifth impurity diffusion region so as to be spaced from the fifth impurity diffusion region; the first portion, the second portion, and the third portion are continuous; the first contact is provided so as to be in contact with the second portion; and the first power supply is connected to the third impurity diffusion region and the fifth impurity diffusion region.

With this configuration, the semiconductor device according to the invention includes a semiconductor substrate of a first conductivity type; a first impurity diffusion region of a second conductivity type that is provided within the semiconductor substrate; a second impurity diffusion region of the first conductivity type that is provided within the first impurity diffusion region; a third impurity diffusion region of the second conductivity type that is provided within the second impurity diffusion region; a fourth impurity diffusion region of the second conductivity type; a fifth impurity diffusion region of the second conductivity type that is provided within the second impurity diffusion region; a first contact; and a first power supply, wherein: the second impurity diffusion region is disposed so as to, in plan view, be surrounded by a first region of the first impurity diffusion region and surround a second region of the first impurity diffusion region; the third impurity diffusion region and the fifth impurity diffusion region are disposed such that the second region is located therebetween in plan view; the fourth impurity diffusion region is disposed between the third impurity diffusion region and the fifth impurity diffusion region in plan view; the fourth impurity diffusion region includes a first portion, a second portion, and a third portion, the second portion is disposed in the second region, the first portion is disposed in the second impurity diffusion region toward the third impurity diffusion region so as to be spaced from the third impurity diffusion region, and the third portion is disposed in the second impurity diffusion region toward the fifth impurity diffusion region so as to be spaced from the fifth impurity diffusion region; the first portion, the second portion, and the third portion are continuous; the first contact is provided so as to be in contact with the second portion; and the first power supply is connected to the third impurity diffusion region and the fifth impurity diffusion region. Thereby, it is possible to reduce breakdown in the fourth impurity diffusion region due to a surge current penetrated into the first contact or breakdown in a region around the fourth impurity diffusion region. In particular, it is possible to prevent breakdown in a region where the fourth impurity diffusion region immediately below the first contact is in contact with another region.

The second portion of the fourth impurity diffusion region of the second conductivity type to which the first contact is connected is formed in the second region of the first impurity diffusion region of the second conductivity type, and the region to which the first contact is connected and the region therebelow have the same conductivity type. Accordingly, breakdown is less likely to occur at the boundary between the fourth impurity diffusion region and the first impurity diffusion region. Furthermore, it is possible to appropriately control the barrier between the fourth impurity diffusion region and the third impurity diffusion region by providing a GCD or the like between the first portion and the third impurity diffusion region, and between the third portion and the fifth impurity diffusion region.

Application Example 4

In the semiconductor device according to the above-described application example, it is preferable that the first contact and the first region are connected to each other by a first interconnect.

With this configuration, the first contact and the first region are connected to each other by a first interconnect, and thereby, the same voltage is supplied to the different portions of the first impurity diffusion region, making it possible to reduce a potential difference within the first impurity diffusion region and suppress the flow of a surge current outside the route to the first power supply, thus reducing breakdown due to a surge current.

DESCRIPTION OF EMBODIMENTS

Figure 1:
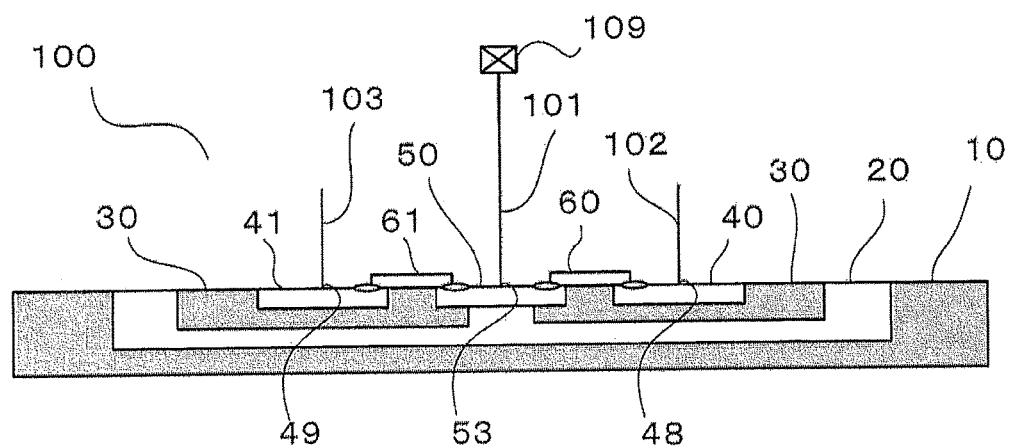
FIG. 1 is a schematic diagram showing a cross-sectional view of a semiconductor device.

Hereinafter, embodiments of the invention will be described with reference to the drawings. Note that for the sake of convenience, the illustrations in the schematic diagrams show portions that are necessary for the description. Accordingly, the same portion may be represented differently in different drawings, and the shape or the size of each portion is not shown precisely. For example, the ratio between vertical and horizontal lengths shown in the drawings may be different from the actual ratio.

Figure 7A:
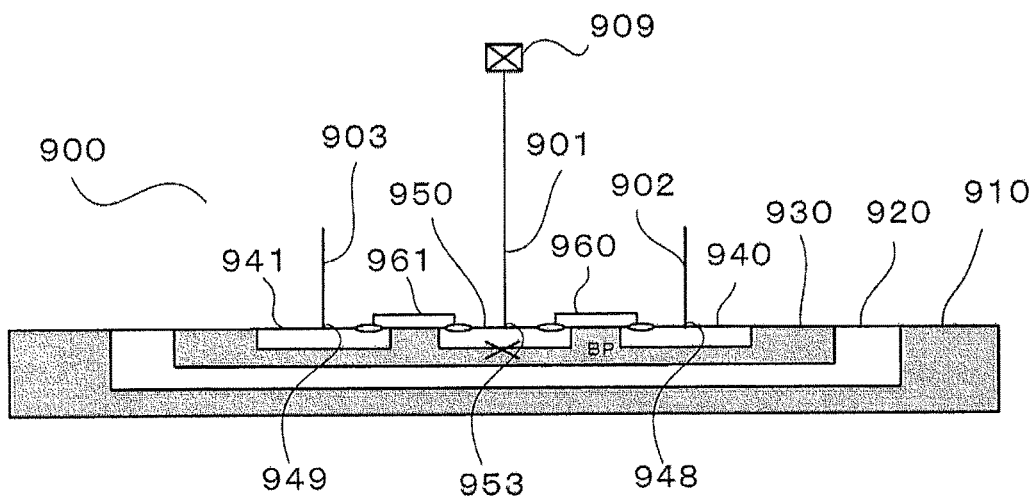
FIGS. 7A-7B are cross-sectional views of a conventional semiconductor device.

First, breakdown of the boundary between a drain region and other regions that is caused by a surge current in a conventional triple well will be described with reference to the drawings. FIG. 7(a) shows a cross-sectional view taken at a specific portion of a semiconductor device 900 having a conventional triple well structure. The semiconductor device 900 includes a semiconductor substrate 910 of a first conductivity type, a first impurity diffusion region 920 of a second conductivity type that is formed on the semiconductor substrate 910, a second impurity diffusion region 930 of the first conductivity type that is formed so as to float within the first impurity diffusion region 920, and a third impurity diffusion region 940 of the second conductivity type, a third impurity diffusion region 941 of the second conductivity type, and a fourth impurity diffusion region 950 of the second conductivity type that are formed so as to float within the second impurity diffusion region 930.

A contact 953 is formed in the fourth impurity diffusion region 950, and a first interconnect 901 is connected to the contact 953. The first interconnect 901 is an interconnect linked to a pad 909 that is to be connected to an external terminal. Additionally, a contact 948 and a contact 949 are formed on the surfaces of the third impurity diffusion region 940 and the third impurity diffusion region 941, respectively. A second interconnect 902 is connected to the contact 948, and a third interconnect 903 is formed on the contact 949. The second interconnect 902 and the third interconnect 903 are connected to a first power supply (not shown). Further, a first gate 960 is provided between the third impurity diffusion region 940 and the fourth impurity diffusion region 950, and a second gate 961 is provided between the third impurity diffusion region 941 and the fourth impurity diffusion region 950.

Here, when the first conductivity type is P-type and the second conductivity type is N-type, the first impurity diffusion region 920 is an N-type well and the second impurity diffusion region 930 is a P-type well. In other words, the semiconductor substrate 910, the first impurity diffusion region 920, and the second impurity diffusion region 930 form a triple well structure. The first power supply may be a GND.

Figure 7B:
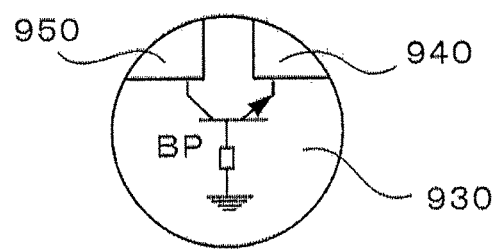

Here, when a surge voltage is applied to the pad 909, a parasitic diode existing between the second impurity diffusion region 930 and the fourth impurity diffusion region 950 causes avalanche breakdown. Subsequently, a bipolar transistor BP (BP in FIG. 7(a) and FIG. 7(b)) constituted by the second impurity diffusion region 930, the third impurity diffusion region 940, and the fourth impurity diffusion region 950 is turned on, making it possible to pass a surge current to the first power supply via the bipolar transistor BP. However, a predetermined time elapses until the bipolar transistor BP is turned on, and during this time, a region in the vicinity of the boundary (in the neighborhood indicated by an "X" mark in FIG. 7) between the fourth impurity diffusion region 950 immediately below the contact and the second impurity diffusion region 930 may undergo breakdown. Although not shown in the drawing and not indicated in the description given above, the same operation as that of the bipolar transistor BP described above also occurs on the third impurity diffusion region 941 side.

Next, a first embodiment of the invention will be described.

First Embodiment

FIG. 1 shows a cross-sectional view taken at a specific portion of a semiconductor device 100 to which the invention is applied. The semiconductor device 100 includes a semiconductor substrate 10 of a first conductivity type, and a first impurity diffusion region 20 of a second conductivity type, a second impurity diffusion region 30 of the first conductivity type, a third impurity diffusion region 40 of the second conductivity type, a third impurity diffusion region 41 of the second conductivity type and a fourth impurity diffusion region 50 of the second conductivity type that are formed in the semiconductor substrate 10. Additionally, a first gate 60 is provided between the third impurity diffusion region 40 and the fourth impurity diffusion region 50, and a second gate 61 is provided between the third impurity diffusion region 41 and the fourth impurity diffusion region 50. The structure formed by the semiconductor substrate 10, the first impurity diffusion region 20, and the second impurity diffusion region 30 constitutes a triple well structure. Here, as in the above-described conventional example, the first conductivity type is P-type and the second conductivity type is N-type. The first impurity diffusion region 20 is an N-type well and the second impurity diffusion region 30 is a P-type well.

Additionally, a contact 53 is formed on the surface of the fourth impurity diffusion region 50, and a first interconnect 101 is connected to the contact 53. The first interconnect 101 is an interconnect linked to the pad 109 that is to be connected to an external terminal. Further, the first impurity diffusion region 20 is disposed in a region immediately below a portion of the fourth impurity diffusion region 50 in which the contact 53 is provided. Furthermore, a contact 48 and a contact 49 are formed on the surfaces of the third impurity diffusion region 40 and the third impurity diffusion region 41, respectively. A second interconnect 102 is connected to the contact 48, and a third interconnect 103 is formed on the contact 49. The second interconnect 102 and the third interconnect 103 are connected to a first power supply (not shown).

Here, when a surge voltage is applied to the pad 109, avalanche breakdown occurs at a parasitic diode existing between the second impurity diffusion region 30 and the fourth impurity diffusion region 50. Subsequently, a bipolar transistor BP constituted by the second impurity diffusion regions 30, the third impurity diffusion region 40, and the fourth impurity diffusion region 50 is turned on, making it possible to pass a surge current to the first power supply via the bipolar transistor BP. Although a predetermined time elapses until the bipolar transistor BP is turned on, the first impurity diffusion region 20 of the same conductivity type as the fourth impurity diffusion region 50 is located immediately below the portion of the fourth impurity diffusion region 50 in which the contact 53 is provided. Thus, it is possible to prevent breakdown in the vicinity of the boundary between the fourth impurity diffusion region 50 and the first impurity diffusion region 20. The first power supply may be a GND.

Example 1

Figure 2:
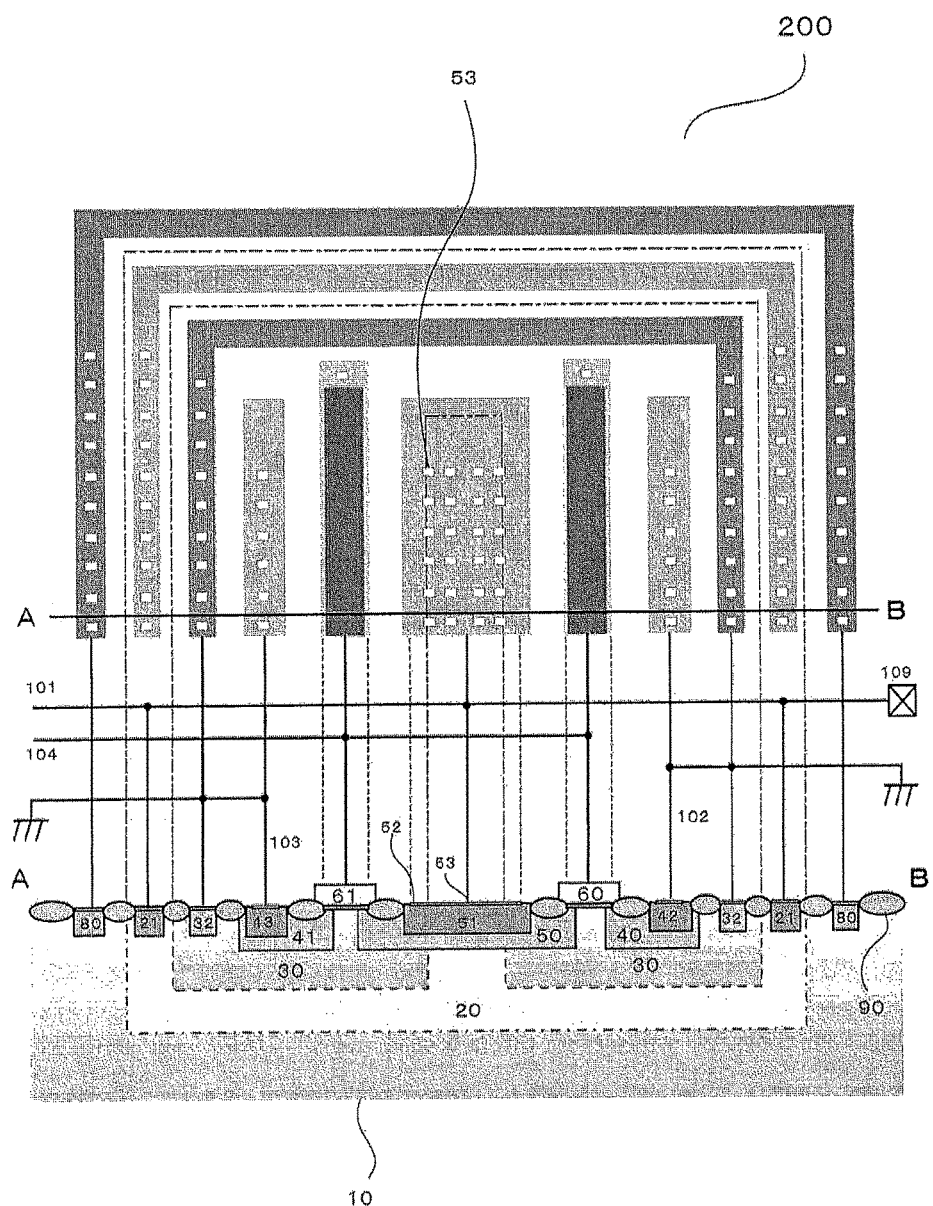
FIG. 2 is a schematic diagram showing plan and cross-sectional views of a semiconductor device according to Example 1.

The present example is an example in which the invention is applied to a semiconductor device 200 (a part of an output element constituting a CMOS) in which the first conductivity type is P-type and the second conductivity type is N-type. FIG. 2 shows a plan view taken at a portion of the semiconductor device 200 and a cross-sectional view taken along the line A-B in the plan view. The dashed lines show the correspondence between the plan view and the cross-sectional view for convenience. Note that in the description of the present example, the same components as those of the semiconductor device 100 are denoted by the same reference numerals, and the description thereof may be omitted.

In each of the regions of the semiconductor device 200, a region having a higher impurity concentration (hereinafter referred to as "tap region") is present on the surface side of the semiconductor substrate. A tap region 80 in the semiconductor substrate 10, a tap region 21 in the first impurity diffusion region 20, a tap region 32 in the second impurity diffusion region 30, a tap region 42 in the third impurity diffusion region 40, a tap region 43 in the third impurity diffusion region 41, and a tap region 51 in the fourth impurity diffusion region 50 correspond to these regions. In addition, the tap region 21 and the tap region 51 are connected to each other via the first interconnect 101. Furthermore, element isolation regions 90 are connected so as to sandwich each of the tap regions. The second impurity diffusion region 30 is formed so as to float in the first impurity diffusion region 20. In plan view, the region immediately below the contact 53 is a partial region of the first impurity diffusion region 20, and the fourth impurity diffusion region 50 is structured to cover the partial region.

The first interconnect 101 is connected to the pad 109, and also connected to a part of a CMOS pair. A first signal wiring 104 linked to the first gate 60 and the second gate 61 is connected to a circuit (not shown). The tap region 32, the tap region 42, and the tap region 43 are connected to a GND.

Because the first interconnect 101 is connected to the tap region 21 and the tap region 51, the potential within the first impurity diffusion region 20 is maintained at the same potential even if a surge voltage is applied to the pad 109. With this structure, it is possible to prevent breakdown due to a surge current from occurring in the vicinity of the boundary between the fourth impurity diffusion region 50 and the first impurity diffusion region 20. When the surge voltage is a positive voltage, after avalanche breakdown has occurred at the parasitic diode between the fourth impurity diffusion region 50 and the second impurity diffusion region 30, a surge current flows to the GND via the second impurity diffusion region 30, the third impurity diffusion region 40, and the third impurity diffusion region 41. When, on the other hand, the surge voltage is a negative voltage, a current flows forward in the parasitic diode between the fourth impurity diffusion region 50 and the second impurity diffusion region 30, and a surge current flows from the tap region 32 to the fourth impurity diffusion region 50.

Additionally, a silicide 52 is formed on the surface of each of the tap region 21, the tap region 32, the tap region 42, the tap region 43, the tap region 51, and the tap region 80. The formation of the silicide 52 enables the resistance value in the current path to be reduced.

Example 2

Figure 3:
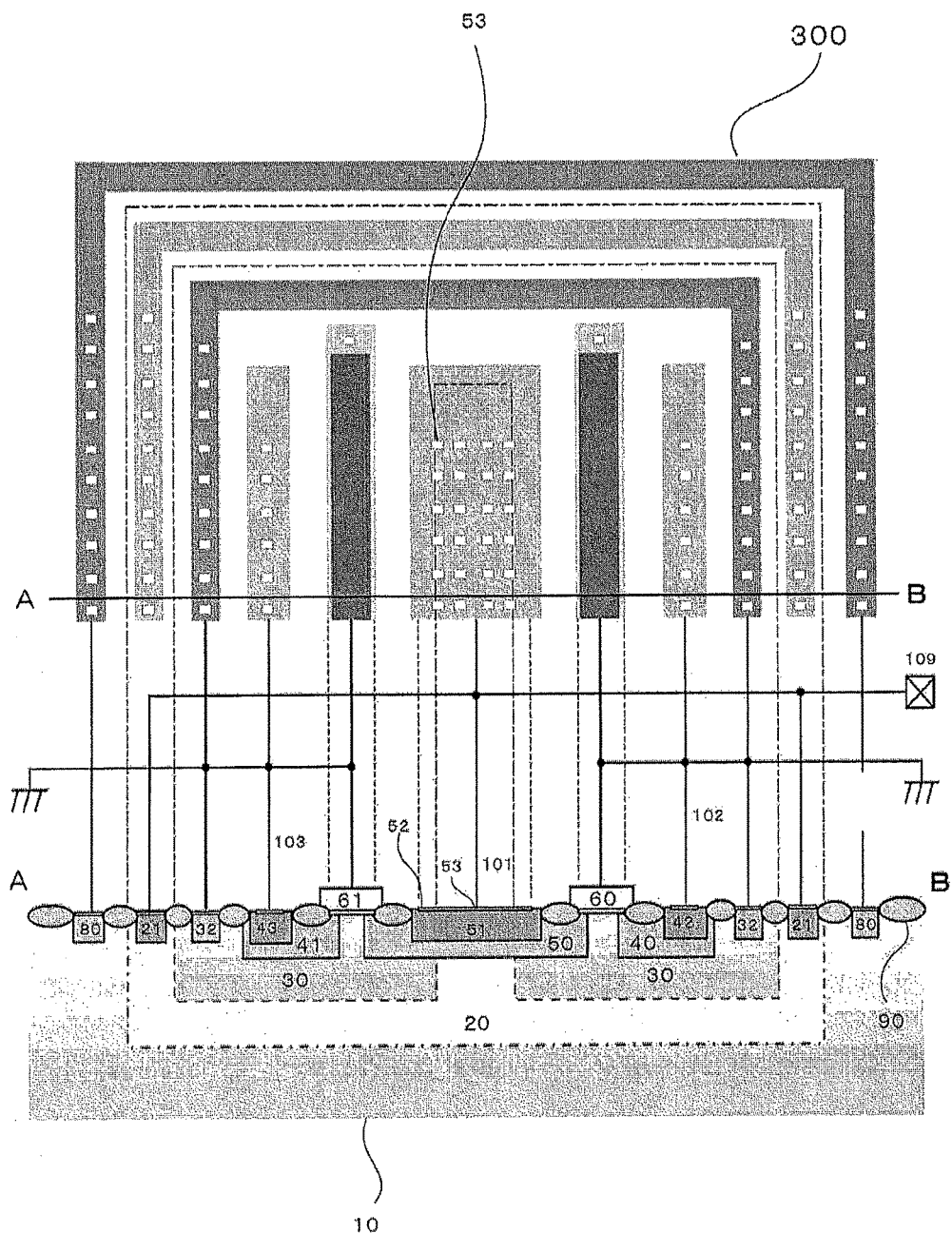
FIG. 3 is a schematic diagram showing plan and cross-sectional views of a semiconductor device according to Example 2.

The present example is an example in which the invention is applied to a semiconductor device 300 (ESD element) in which the first conductivity type is P-type and the second conductivity type is N-type. FIG. 3 shows a plan view taken at a portion of the semiconductor device 300, and a cross-sectional view taken at the line A-B of the plan view. The dashed lines show the correspondence between the plan view and the cross-sectional view for convenience. In the description of the present example as well, the same components as those of the semiconductor device 100 or the semiconductor device 200 are denoted by the same reference numerals, and the description thereof may be omitted.

In the present example, the first gate 60 is connected to the second interconnect 102. Further, the second gate 61 is connected to the third interconnect 103. Due to the first gate 60 and the second gate 61 being connected to the GND, the barrier between the fourth impurity diffusion region 50 and the third impurity diffusion region 40 is appropriately maintained. The semiconductor device 300 is an element that is used only for ESD, and the first interconnect 101 is to be connected to another input/output element. The rest of the structure is the same as that of the semiconductor device 200. With this structure, it is possible to prevent breakdown due to a surge current from occurring in the vicinity of the boundary between the fourth impurity diffusion region 50 and the first impurity diffusion region 20.

When the surge voltage is a positive voltage, after avalanche breakdown has occurred at a parasitic diode between the fourth impurity diffusion region 50 and the second impurity diffusion region 30, a surge current flows to the GND via the second impurity diffusion region 30, the third impurity diffusion region 40, and the third impurity diffusion region 41. When, on the other hand, the surge voltage is a negative voltage, a current flows forward in the parasitic diode between the fourth impurity diffusion region 50 and the second impurity diffusion region 30, and a surge current flows from the tap region 32 to the fourth impurity diffusion region 50.

Second Embodiment

In the present embodiment, a description will be given of a method for producing the semiconductor device 200 or the semiconductor device 300. Note that in the description of the present embodiment, the same or equivalent components as those of the semiconductor devices described in the first embodiment are denoted by the same reference numerals, and the description thereof may be omitted.

Referring first to FIGS. 4 and 5, a method for producing a conventional semiconductor device and a method for producing a semiconductor device according to the invention will be described. FIGS. 4 and 5 show cross-sectional views taken at the same position as those shown in FIG. 2 or 3.

Figure 4A:
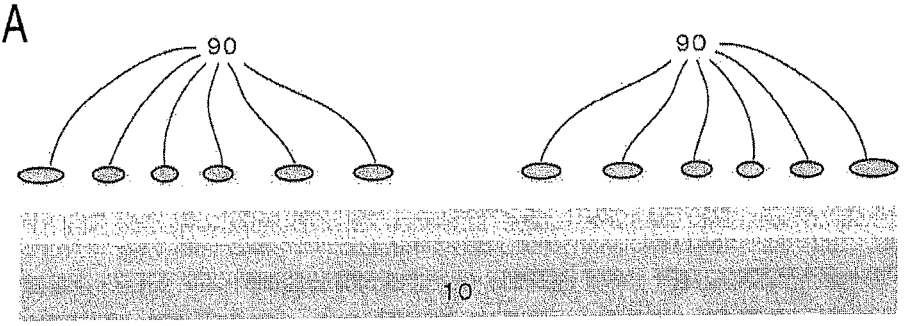
FIGS. 4A-4D are diagrams showing a process for producing a semiconductor device.

First, a plurality of element isolation regions 90 are formed on the surface of a first face of a semiconductor substrate 10 of a first conductivity type (FIG. 4(a)). Here, the plurality of element isolation regions 90 include a first element isolation region 91 and a second element isolation region 92.

Figure 4B:
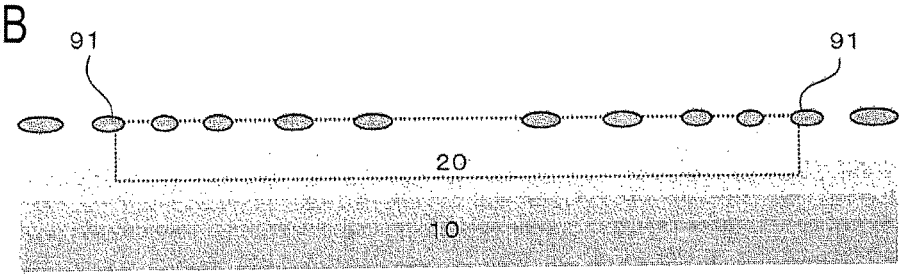

Then, a region surrounded by the first element isolation region 91 is subjected to a treatment such as ion implantation, thus forming a first impurity diffusion region 20 (FIG. 4(b)).

Figure 5A:
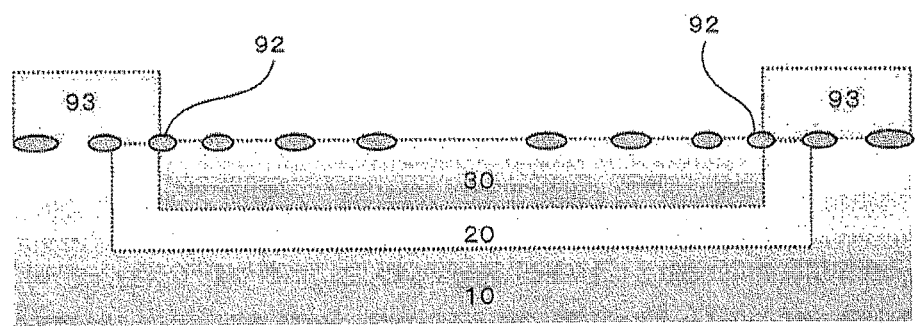
FIGS. 5A-5B are diagrams showing a process for producing a conventional semiconductor device.
Figure 5B:
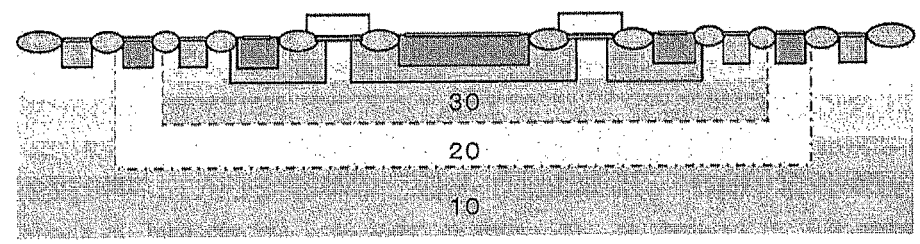

Then, a resist 93 is formed so as to leave a region surrounded by the second element isolation region 92, followed by ion implantation, to form a second impurity diffusion region 30 (FIG. 5(a)).

The steps are further repeated, and thereby a third impurity diffusion region 40, a fourth impurity diffusion region 50, a first gate 60, a second gate 61 and so forth are formed within the second impurity diffusion region 30. Additionally, a tap region having a higher concentration is formed in regions that are not covered by the element isolation regions 90 (FIG. 5(b)).

Next, a method for producing a semiconductor device according to the invention will be described.

First, a plurality of element isolation regions 90 are formed on the surface of a first face of a semiconductor substrate 10 of a first conductivity type (FIG. 4(a)).

Then, a region surrounded by the first element isolation region 91 is subjected to ion implantation, thus forming a first impurity diffusion region 20 (FIG. 4(b)).

Figure 4C:
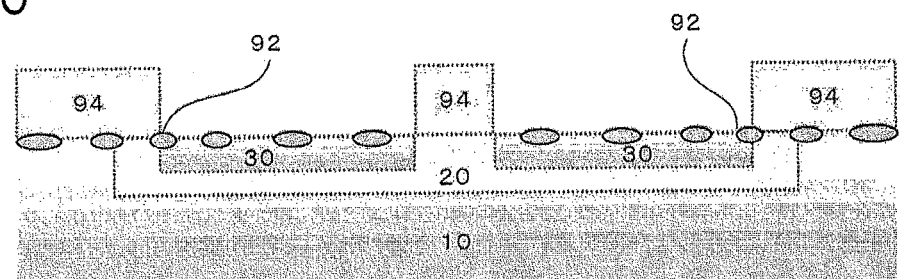

Then, a resist 94 is formed so as to leave a partial region on the surface of the first impurity diffusion region 20 included in the region surrounded by the second element isolation region 92, followed by ion implantation, to form a second impurity diffusion region 30 (FIG. 4(c)). Here, the region other than the partial region located on the surface of the first impurity diffusion region 20 is a region in which a contact 53 is formed in a subsequent step.

The steps are further repeated, and thereby a third impurity diffusion region 40, a fourth impurity diffusion region 50, a first gate 60, a second gate 61 and so forth are formed within the second impurity diffusion region 30. Additionally, a tap region having a higher concentration is formed in regions that are not covered by the element isolation regions 90 (FIG. 4(d)).

Figure 4D:
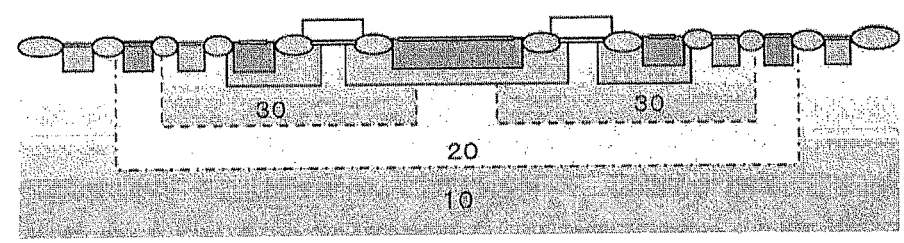
Figure 6:
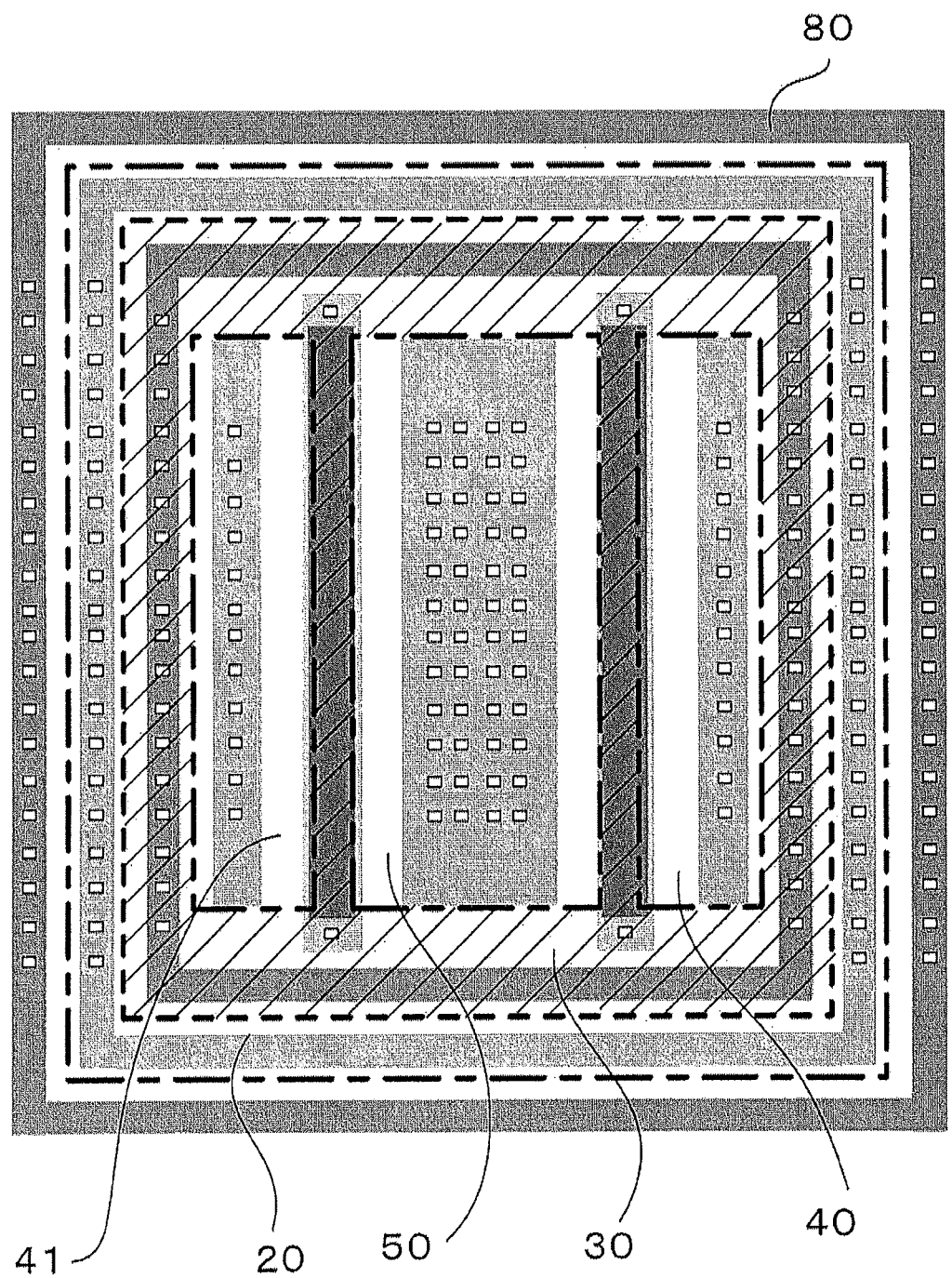
FIG. 6 is a schematic diagram showing a plan view of a semiconductor device.

FIG. 6 shows a plan view of the semiconductor device 200 or the semiconductor device 300 after the step shown in FIG. 4(d). In FIG. 6, the dashed lines indicate the arrangement of the first impurity diffusion region 20, the second impurity diffusion region 30, the third impurity diffusion region 40, the third impurity diffusion region 41, and the fourth impurity diffusion region 50 on the surface of the semiconductor device 200 or the semiconductor device 300. Below the portion of the fourth impurity diffusion region 50 in which the contact 53 is formed, the first impurity diffusion region 20 is formed, without the second impurity diffusion region 30 being formed.

As described in the present embodiment, the only difference between the method for producing the semiconductor device according to the invention and the method for producing the conventional semiconductor device is the shape of the resist 93 and the resist 94 formed. Therefore, it is possible to produce the semiconductor device according to the invention without making any significant change to manufacturing facilities, for example.

Although embodiments and application examples of the invention have been described above, the application of the invention is not limited to the above-described content. The invention is widely applicable without departing from the spirit or essential characteristics thereof. For example, although the first conductivity type is P-type and the second conductivity type is N-type in the embodiments, the invention is applicable where the first conductivity type is N-type and the second conductivity type is P-type.

REFERENCE SIGNS LIST

10 Semiconductor substrate
20 First impurity diffusion region
21 Tap region
30 Second impurity diffusion region
32 Tap region
40 Third impurity diffusion region
41 Third impurity diffusion region
42 Tap region
43 Tap region
48 Contact
49 Contact
50 Fourth impurity diffusion region
51 Tap region
52 Silicide
53 Contact
60 First gate
61 Second gate
80 Tap region
90 Element isolation region
91 First element isolation region
92 Second element isolation region
93 Resist
94 Resist
100 Semiconductor device
101 First interconnect
102 Second interconnect
103 Third interconnect
109 Pad
200 Semiconductor device
300 Semiconductor device
900 Semiconductor device
901 First interconnect
902 Second interconnect
903 Third interconnect
909 Pad
910 Semiconductor substrate
920 First impurity diffusion region
930 Second impurity diffusion region
940 Third impurity diffusion region
941 Third impurity diffusion region
948 Contact
949 Contact
950 Fourth impurity diffusion region
953 Contact
960 First gate
961 Second gate

The invention claimed is:

1. A semiconductor device comprising:
a first impurity region of a second conductivity type that is arranged in a semiconductor substrate of a first conductivity type;
a second impurity region of a first conductivity type that is arranged in the first impurity region;
a third impurity region of a second conductivity type that is arranged in the second impurity region and is connected to a GND;
a fourth impurity region of a second conductivity type that is arranged in at least the second impurity region separately from the third impurity region;
a contact that is arranged in the fourth impurity region; and
a gate that is arranged above the second impurity region between the third and fourth impurity regions and is connected to the GND;
wherein the first impurity region includes a convex portion contacting the fourth impurity region, and the convex portion overlaps the contact in plan view;
a first portion of the gate overlaps the fourth impurity region in plan view; and
the second impurity region overlaps with the fourth impurity region in plan view.

2. The semiconductor device according to claim 1, wherein a second portion of the gate overlaps the third impurity region in plan view.

3. The semiconductor device according to claim 1, wherein the second impurity region is connected to the GND.

4. The semiconductor device according to claim 1, wherein the first impurity region is connected to a pad, and the fourth impurity region is connected to the pad via the contact.

5. The semiconductor device according to claim 1, wherein the fourth impurity region includes a first portion and a second portion, and the second portion is arranged more toward a surface side of the semiconductor substrate than the first portion, and
an impurity concentration of the second portion of the fourth impurity region is higher than that of the first portion of the fourth impurity region.

6. The semiconductor device according to claim 1, wherein the third impurity region includes a first portion and a second portion, and the second portion is arranged more toward a surface side of the semiconductor substrate than the first portion, and
an impurity concentration of the second portion of the third impurity region is higher than that of the first portion of the third impurity region.

7. The semiconductor device according to claim 1, wherein the second impurity region includes a first portion and a second portion, and the second portion is arranged more toward a surface side of the semiconductor substrate than the first portion, and
an impurity concentration of the second portion of the second impurity region is higher than that of the first portion of the second impurity region.

8. The semiconductor device according to claim 7, wherein the second portion of the second impurity region surrounds the gate and the third and fourth impurity regions in plan view.

9. The semiconductor device according to claim 1, wherein the first impurity region includes a first portion and a second portion, and the second portion is arranged more toward a surface side of the semiconductor substrate than the first portion, and
an impurity concentration of the second portion of the first impurity region is higher than that of the first portion of the first impurity region.

10. The semiconductor device according to claim 9, wherein the second portion of the first impurity region surrounds the gate and the second, third and fourth impurity regions in plan view.

11. The semiconductor device according to claim 1, wherein a fifth impurity region of a first conductivity type is arranged at a surface side of the semiconductor substrate, and
an impurity concentration of the fifth impurity region is higher than that of the semiconductor substrate.

12. The semiconductor device according to claim 11,
wherein the fifth impurity region surrounds the gate and the first, second, third and fourth impurity regions in plan view.

13. The semiconductor device according to claim 5,
wherein a first separation region is arranged at a surface side of the substrate of the first portion of the fourth impurity region between the gate and the second portion of the fourth impurity region.

14. The semiconductor device according to claim 13,
wherein a first silicide region is arranged at a surface side of the semiconductor substrate of the fourth impurity region, and
the first silicide region is separated from the first separation region.

15. The semiconductor device according to claim 6,
wherein a second separation region is arranged at a surface side of the substrate of the first portion of the third impurity region between the gate and the second portion of the third impurity region.

16. The semiconductor device according to claim 15,
wherein a second silicide region is arranged at a surface side of the semiconductor substrate of the third impurity region, and
the second silicide region is separated from the second separation region.

17. The semiconductor device according to claim 16,
wherein a third separation region is arranged at a surface side of the substrate of the first portion of the second impurity region between the second portion of the third impurity region and the second portion of the second impurity region, and the second silicide region is separated from the third separation region.

18. The semiconductor device according to claim 17,
wherein a third silicide region is arranged at a surface side of the semiconductor substrate of the second impurity region, and
the third silicide region contacts the third separation region.

* * * * *